United States Patent [19]

Shirato

[11] 4,133,049
[45] Jan. 2, 1979

[54] MEMORY CIRCUIT ARRANGEMENT UTILIZING ONE-TRANSISTOR-PER-BIT MEMORY CELLS

[75] Inventor: Hajime Shirato, Tokyo, Japan

[73] Assignee: Nippon Electric Co., Ltd., Tokyo, Japan

[21] Appl. No.: 797,917

[22] Filed: May 18, 1977

[30] Foreign Application Priority Data

May 21, 1976 [JP] Japan .................................. 51-58945

[51] Int. Cl.$^2$ ............................................. G11C 11/40
[52] U.S. Cl. .................................. 365/208; 365/154; 365/207; 365/186; 307/238
[58] Field of Search .................... 340/173 R, 173 CA; 307/238, 279; 365/154, 207, 208, 186

[56] References Cited

U.S. PATENT DOCUMENTS

| 3,882,326 | 5/1975 | Kruggle | 340/173 CA |
| 4,031,522 | 6/1977 | Reed et al. | 340/173 CA |

Primary Examiner—Terrell W. Fears
Attorney, Agent, or Firm—Hopgood, Calimafde, Kalil, Blaustein & Lieberman

[57] ABSTRACT

A memory circuit arrangement employing one-transistor-per-bit memory cells in which differential sense amplifiers are utilized for detecting the state of the stored bits. First and second digit lines are arranged substantially parallel to and adjacent to each other and first and second parallel word lines are arranged substantially at right angles to the digit lines. Memory cells are connected at each cross point between the digit lines and the word lines.

6 Claims, 6 Drawing Figures

MEMORY CIRCUIT ARRANGEMENT UTILIZING ONE-TRANSISTOR-PER-BIT MEMORY CELLS

DISCLOSURE OF THE INVENTION

The present invention relates to a memory circuit arrangement employing insulated gate type field effect transistors, and more particularly, to a memory circuit arrangement consisting of one-transistor-per-bit memory cells.

In a heretofore known memory circuit employing insulated gate type field effect transistors, memory cells consisting of, 4-transistors per bit, for example, have been utilized. However, in such a memory cell each bit line is long because of the large number of constituent elements, so that when the circuit is integrated the stray capacity associated with the bit line becomes large. Therefore high speed operation of the memory circuit cannot be expected.

In order to obviate these disadvantages, memory cells consisting of one transistor per bit are also utilized in the prior art. In a memory circuit utilizing these one-transistor-per-bit memory cells differential sense amplifiers are employed for the respective bits, and a pair of bit lines connected to differential inputs of each sense amplifier are arrayed on opposite sides of the sense amplifier extending in opposite directions to each other. Read out memory cell information is amplified by the corresponding sense amplifier and is sent out on a pair of bit lines as true/complement signals. These true/complement output signals are respectively transmitted to a pair of input/output bus lines via a pair of input/output bus line connecting means. Thereafter the signals are applied to inputs of a main differential amplifier, and after having been further amplified by this main amplifier they are transmitted to an output circuit. A pair of these input/output bus line connecting means are both controlled by an output of the same word selection decoder. Since the decoder must be placed near one of the bit lines in view of the circuit arrangement, the control line extending to the above-described connecting means for connecting the other bit line to the input-/output bus line is required to extend a long distance from the decoder. As a result, the area of the integrated circuit is increased.

With regard to writing information into a memory cell, such a prior art system requires that either "1" or "0" logic information to be written in is applied only to the bit line to which said cell is connected. Accordingly, the state of the sense amplifier whose input is connected to the bit line would be changed by the written in logic information applied to only one of its differential inputs. Therefore, writing speed is unfavorably reduced.

An object of the present invention is to provide a memory circuit arrangement which includes a fewer number of circuit elements, and yet which can achieve high speed operations.

According to one feature of the present invention, a memory circuit arrangement comprises a pair of first and second digit lines arrayed substantially in parallel to and adjacent to each other, first and second word lines intersecting substantially at right angles with said pair of digit lines, a first memory cell provided at the cross-point between said first digit line and said first word line, connected to said respective lines, and consisting of one field effect transistor and one capacitive element, a second memory cell provided at the cross-point between said second digit line and said second word line, connected to said respective lines, and consisting of one field effect transistor and one capacitive element, a sense amplifier to whose differential input terminals the pair of first and second digit lines are connected for amplifying a potential difference between the pair of digit lines, a pair of switching means for simultaneously connecting the pair of digit lines respectively to a pair of input/output bus lines, and selecting means for selectively controlling the pair of switching means in coincidence.

According to another feature of the present invention, the above-featured memory circuit arrangement further comprises means for simultaneously applying a logic information "1" to one of the pair of digit lines and a logic information "0" to the other digit line when the pair of switching means have been controlled by the selecting means to connect the pair of digit lines to the pair of input/output bus lines, respectively.

Above-mentioned and other features and objects of the present invention will become more apparent by reference to the following description taken in conjunction with the accompanying drawings.

DETAILED DESCRIPTION

Figure 1:
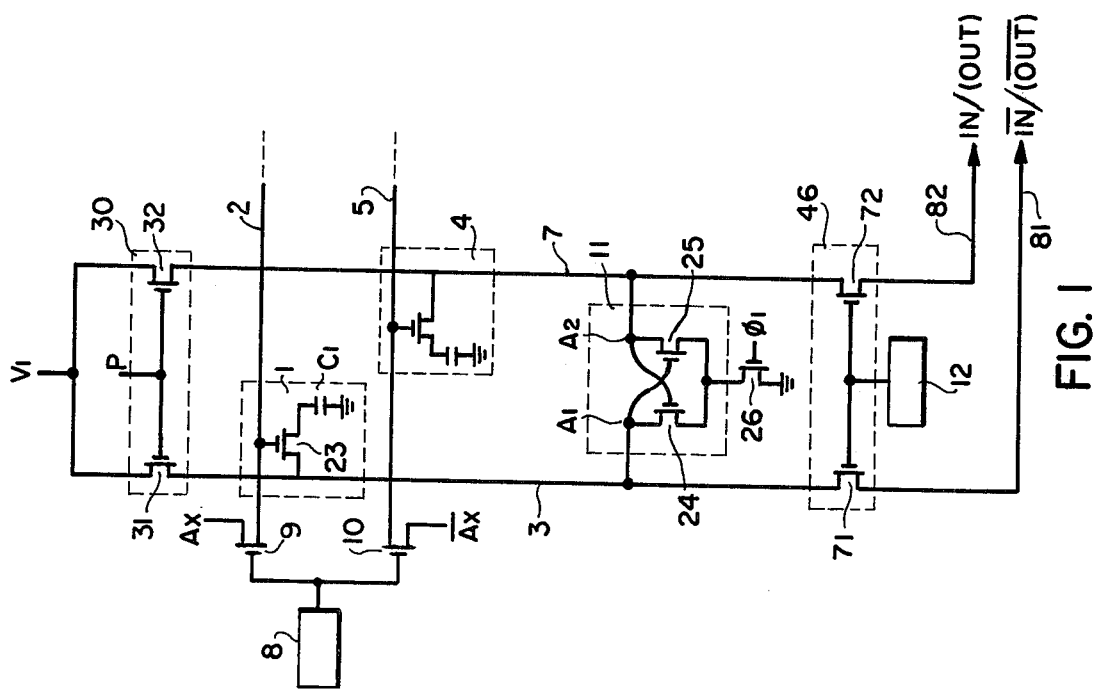
FIG. 1 is a schematic circuit diagram showing a portion of a memory circuit according to one preferred embodiment of the present invention.

FIG. 1 is a partial schematic circuit diagram of a memory circuit according to the present invention which depicts only a 2 bit portion of such a memory circuit. In this figure, a pair of digit lines 3 and 7 are arranged substantially in parallel to each other, and on the extensions of these digit lines 3 and 7 is provided a sense amplifier 11 whose differential inputs are connected to the digit lines 3 and 7, respectively. Further, the digit lines 3 and 7 are connected to a voltage source $V_1$ through metaloxide semiconductor type transistors (hereinafter referred to as MOST) 31 and 32 included in pre-charge means 30. To the gates of the MOST's 31 and 32 is applied a pre-charge signal P. In addition, the digit lines 3 and 7 are connected to a pair of input/output bus lines 81 and 82, respectively, to which true and complementary input (output) signals IN (OUT) and $\overline{IN}$ ($\overline{OUT}$) are applied, respectively, through MOST's 71 and 72 included in input/output bus connecting means 46. To the gates of the MOST's 71 and 72, which constitute transfer gates, is applied an output of a Y-docoder 12 for simultaneously selecting the pair of digit lines 3 and 7. Word lines 2 and 5 are both arranged substantially at right angles with the pair of digit lines 3 and 7.

A memory cell 1 is provided at the cross-point between the word line 2 and the digit line 3, and a memory cell 4 is provided at the cross-point between the word line 5 and the digit line 7.

More particularly, memory cell 1 consists of an information capacitor $C_1$ and an information transfer MOST 23 connected between the capacitor $C_1$ and the digit line 3 and having its gate connected to the word line 2. The memory cell 4 has a similar construction to memory cell 1. A sense amplifier 11 is provided common to the memory cells 1 and 4, and consists of a pair of switching MOST's 24 and 25 cross-coupled at input/output points $A_1$ and $A_2$, which points are connected to the pair of digit lines 3 and 7, respectively. At a common junction between the sources of MOST's 24 and 25 and ground is provided another MOST 26 for activating the sense amplifier 11, and activation signal $\phi_1$ is applied to the gate of the MOST 26.

The word line 2 is connected to a source of a MOST 9 having an output of an X-decoder 8 applied to its gate, and an address signal $A_x$ is applied to the drain of the MOST 9 that is different from the address inputs applied to the X-decoder 8. The word line 5 is connected to a source of a MOST 10 having an output of the X-decoder 8 applied to its gate, and another address signal $A_x$ is applied to the drain of the MOST 10 is applied another address having an opposite polarity to the signal $A_x$. MOST's 9 and 10 constitute transfer gates.

At first, in response to the pre-charge signal P, the MOST's 31 and 32 begin conducting and thereby digit lines 3 and 7 are both pre-charged up to the level $V_1$. At this moment, the input/output points $A_1$ and $A_2$ of sense amplifier 11 are also pre-charged up to the level $V_1$. When the information in memory cell 1 is read out, the output of the X-decoder 8 is activated and thereby the MOST's 9 and 10 begin conducting. Then, assuming that the signal $A_x$ is at the level $V_1$, the signal $\overline{A_x}$ is of an opposite polarity thereto, so that word line 2 (only) is activated but the word line 5 is not activated. Accordingly, the transfer MOST 23 in the memory cell 1 begins conducting to transfer the information stored in the capacitor $C_1$ to the digit line 3. Since the potential on the digit line 7 does not change from the pre-charge level $V_1$, a potential difference appears between the digit lines 3 and 7.

Thereafter, the sense amplifier 11 is activated by the activation signal $\phi_1$ to amplify this potential difference. As a result, a true value and a complementary value, respectively, of the memory information stored in the memory cell 1 is provided on the digit lines 3 and 7. Subsequently, the MOST's 71 and 72 are simultaneonsly activated by the Y-decoder 12, and thereby true and complementary outputs OUT and $\overline{OUT}$ are obtained on the input/output bus lines 82 and 81, respectively. These true and complementary outputs are further amplified by a main amplifier (not shown) to be transmitted to an external circuit.

Selection of the memory cell 4 for reading, can obviously be achieved by activating the output of the decoder 8 and also bringing the signal $\overline{A_x}$ to the level $V_1$. When this occurs, a complementary value $\overline{OUT}$ and a true value OUT are respectively obtained on the input/output bus lines 81 and 82.

Writing information into memory cell 1 is achieved by bringing the address signal $A_x$ to the level $V_1$, turning the MOST 23 of the cell 1 on and also turning the MOST's 71 and 72 on by means of the Y-decoder 12 - similar to the above-described case for reading. At this time, a true value IN and a complementary value $\overline{IN}$, respectively, of the information to be written are applied to the input/output bus lines 81 and 82. On the other hand, when information is written on the memory cell 4, the signal $\overline{A_x}$ is brought to the level $V_1$ and a complementary value $\overline{IN}$ and a true value IN, respectively, of the information to be written are applied to the input/output bus lines 81 and 82. In general, a write cycle is performed immediately after a read cycle.

Consider now the case where in a read cycle the MOST 24 in the sense amplifier 11 is conducting and the MOST 25 is not conducting, and in the subsequent write cycle a logic information "1" is to be written into memory cell 1. Since the logic "1" and the logic "0" are simultaneously applied as input signals to the input/output bus lines 81 and 82, respectively, the input/output terminals $A_1$ and $A_2$ of the sense amplifier 11 are concurrently changed to logic "1" and "0", respectively, so that the MOST 24 is momentarily turned off while at the same time the MOST 25 is momentarily turned on. Accordingly, due to the simultaneously switching of MOST 24 and MOST 25, the logic "1" is quickly written into the memory cell 1. Thus in the circuit shown in FIG. 1, two word lines are controlled with a single X-decoder and two bit lines are controlled with a single Y-decoder, so that write operations at a high speed become possible.

Figure 2:
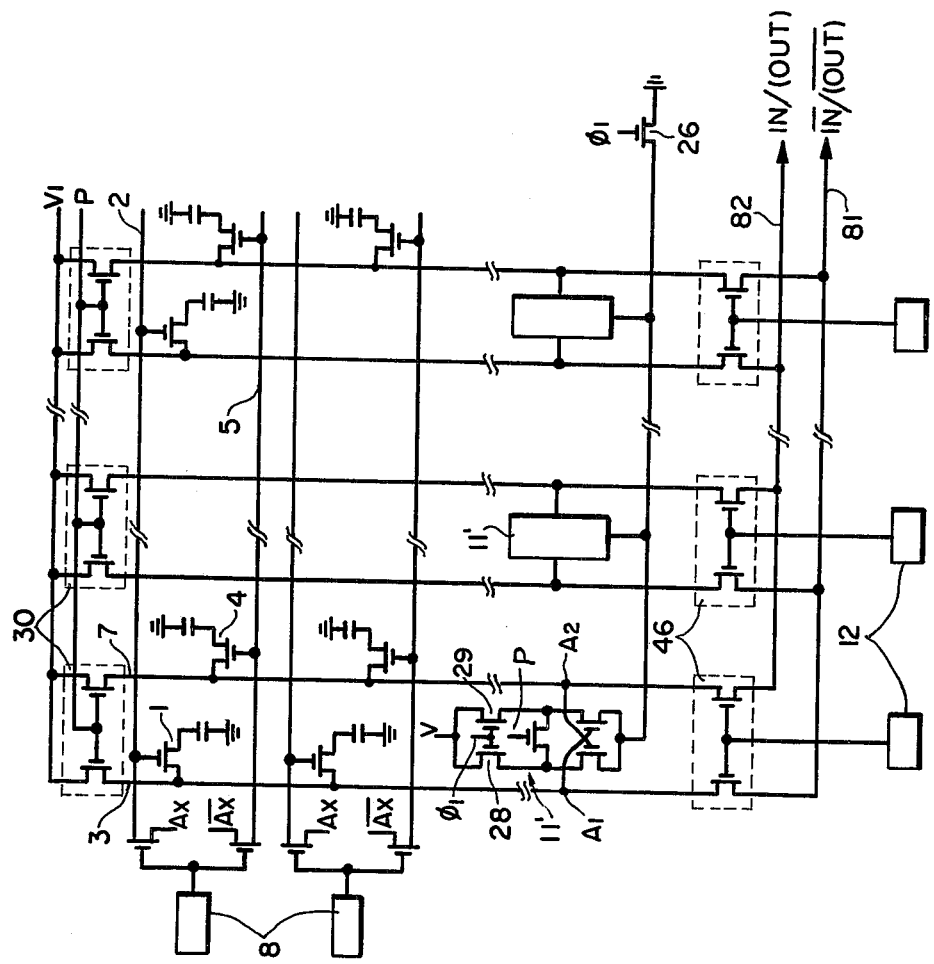
FIG. 2 is a systematic representation of a memory circuit according to one preferred embodiment of the present invention.

FIG. 2. is extention of the schematic partial circuit diagram in FIG. 1 into a 4096-bit memory circuit. The FIG. 2 memory includes 32 X-decoders 8 for controlling 32 pairs of, i.e., 64 word lines, each pair consisting of word lines 2 and 5, signal sources for address signals $A_x$ and $\overline{A_x}$, 64 Y-decoders 12 for controlling 64 pairs, i.e., 128 digit lines, each pair consisting of digit lines 3 and 7, and 64 sense amplifiers 11'. Each of the 64 sense amplifiers 11' includes a pair of load MOST's 28 and 29 for precisely refreshing the memory cells after activation of the word line, and a MOST 27 for balancing the amplifier input levels before activation of the word line. However, since such arrangement of MOST's 27 – 29 is well known in the art, a more detailed description will be omitted.

In FIG. 2, it is a matter of course that it is possible to provide as many X-decoders 8 as many as the number of the word lines, and to connect them individually to the word lines without employing the address signals $A_x$ and $\overline{A_x}$. In this case the number of the X-decoders is doubled.

In the memory circuit according to the present invention, since true and complementary levels can be provided directly on a pair of digit lines, inversion of an output state a differential amplifier and writing on a memory cell can be effected at a high speed. In addition, since the transfer of read-out signals to the output bus lines is also effected in the form of true and complementary signals, a memory circuit insensitive to noises can be constructed. Furthermore, as will be apparent from FIG. 2, the fact that for a 4096-bit memory device only 32 X-decoders and 64 Y-decoders are required, implies that in contrast to the prior art construction consisting of 64 X-decoders and 64 Y-decoders the number of transistors forming decoders can be reduced. As, as the number of the X-decoders can be reduced by a factor of ½, the memory circuit has characteristic merit since the load upon the drive circuit for the address input signals of the X-decoders can be lightened.

Figure 3:
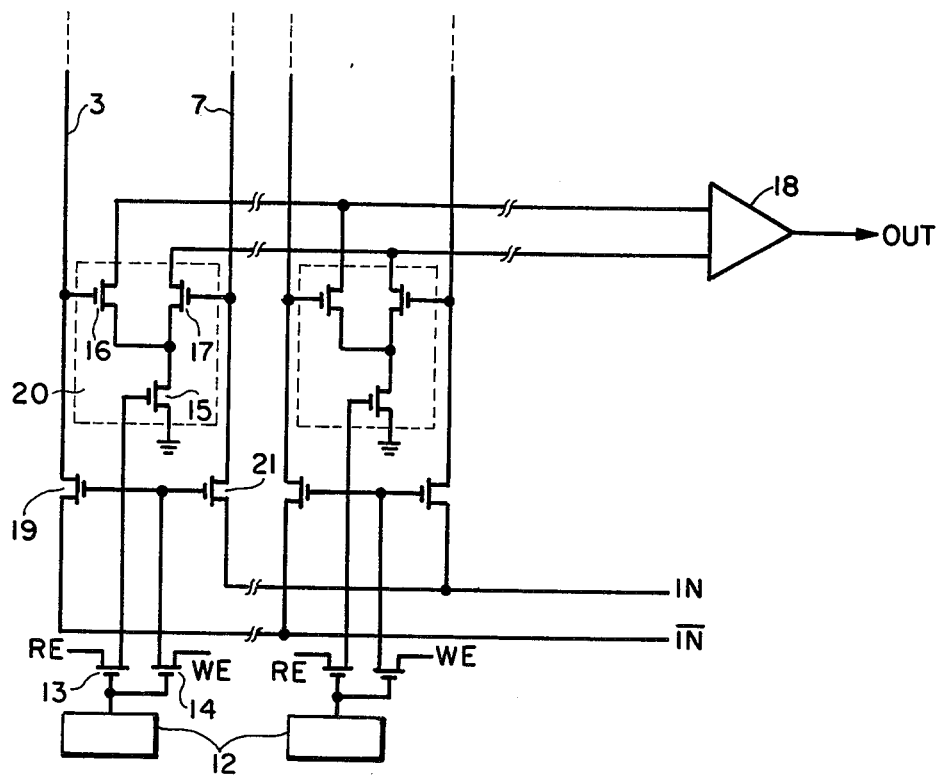
FIG. 3 is a schematic circuit diagram showing an input/out bus separator circuit employed in the present invention.

While the memory circuit is illustrated according to an input/output common bus system in FIG. 2, it is also possible to separate an input bus and an output bus and to provide a buffer circuit between the digit line and the output bus. FIG. 3 shows one example of such modification, and the buffer circuit 20 consists of MOST's 15, 16 and to 17. In case that a pair of digit lines 3 and 7 have been selected by the Y-decoder 12, upon reading in response to a timing signal RE the MOST 15 is activated via a MOST 13. The digit line signal levels are amplified by the MOST's 16 and 17, transferred to the output bus lines and further buffered by an output amplifier 18 to be provided as an output. Upon writing, in response to a timing signal WE the MOST's 19 and 21 are turned on via a MOST 14, and thereby true and complementary input signals are transferred to the digit lines.

Figure 4:
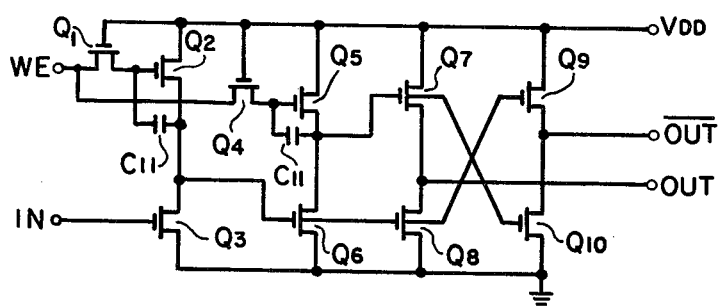
FIG. 4 is a schematic circuit diagram showing a writing circuit utilized in the present invention.

FIG. 4 is a schematic circuit diagram showing one example of a write signal generator circuit to be used for the present invention, in which a first stage inverter is constructed of a switching MOST $Q_3$ having an input signal IN applied to its gate and a load MOST $Q_2$ for the MOST $Q_3$. A second stage inverter is constructed of a switching MOST $Q_6$ having the output of the first inverter applied to its gate and a load MOST $Q_5$ for the MOST $Q_6$. A first stage push-pull circuit is constructed of a MOST $Q_7$ having the output of the second stage inverter applied to its gate input and a MOST $Q_8$ having the output of the first stage inverter applied to its gate input. Also a second stage push-pull circuit is constructed of a MOST $Q_9$ having the output of the first stage inverter applied to its gate input and a MOST $Q_{10}$ having the output of the second stage inverter applied to its gate input. The respective outputs OUT and $\overline{OUT}$ from the first stage push-pull circuit and the second stage push-pull circuit, respectively, form true and complementary write signals responsive to the input signal IN.

The load MOST's $Q_2$ and $Q_5$ have a write command signal WE applied to their gates via MOST's $Q_1$ and $Q_4$, respectively, and thereby the MOST's $Q_2$ and $Q_5$ are maintained conducting. Then, in response to the input signal IN, the MOST $Q_3$ becomes conducting or non-conducting, so that an inverted signal for the input signal IN is obtained at the output of the first stage inverter. The second stage inverter MOST $Q_6$ is controlled by this inverted signal, so that a signal of the same polarity as the input signal IN is obtained as a second stage inverter output.

The two push-pull circuits operate in response to the outputs of these inverters, and at the respective outputs OUT and $\overline{OUT}$ true and complementary signals are obtained responsive to the input signal IN. These signals OUT and $\overline{OUT}$ are obtained true and complementary signals responsive to the input signal IN. These signals OUT and $\overline{OUT}$ could be applied to the pair of input-/output bus lines, respectively, in FIGS. 1 and 2. It is to be noted that capacitors $C_{10}$ and $C_{11}$ inserted between the gates and sources of the load MOST's $Q_2$ and $Q_5$, respectively, are boot-strap capacitors which serve to pull up the high levels at the respective inverter outputs to the voltage source level $V_{DD}$.

In FIG. 1, the amplifier 11 operates with the difference signal level between the digit lines 3 and 7 applied as an input signal after activation of a word line, but during the period after activation of the word line and before activation of the amplifier 11 either one of the digit lines 3 and 7 is kept at the given voltage level $V_1$ by the pre-charge means 30. More particularly, if the word line 2 is activated, the digit line 7 is kept at the $V_1$ level, whereas if the word line 5 is activated, the digit line 3 is kept at the $V_1$ level. Accordingly, when the memory cell information is the logic "1", the voltage level at the memory cell capacitor must be higher than $V_1$. Therefore, if another pair of memory cells 22 (called reference cell) are provided as shown in FIG. 5, the digit line voltage level on the side that is kept at the $V_1$ level after activation of the word line can be reduced to $V_1 - \Delta V$.

More particularly, a pair of reference cell selection lines 60 61 cross at right angles with the digit lines 3 and 7, and reference cells 22 having the same constructions are disposed respectively at the cross-point between the digit line 3 and the selection line 61 and at the cross-point between the digit line 7 and the selection line 60. Each of the reference cells 22 consists of a capacitor $C_2$ for storing reference information, a transfer MOST 63 for transferring this stored information to the digit line, and a discharging MOST 64 for discharging an electric charge on the capacitor $C_2$ upon pre-charging. The selection lines 60 and 61 are respectively connected to the sources of the MOST's 65 and 66. Address signal lines Ax and $\overline{A_x}$, are respectively connected to the drains of the MOST's 65 and 66. To the respective gates of the MOST's 65 and 66 is applied a voltage for turning these MOST's on by another MOST 67.

In the above-mentioned construction, when the memory cell 1 is selected by the output of the X-decoder 8 and the address signal $A_x$, memory information is provided on the digit line 3. At the same time, the reference cell 22 is selected by the signal $A_x$ on the selection line 60, so that reference information on the reference cell 22 is provided on the digit line 7. Since the information on the reference cell 22 is always turned to "0" by the MOST 64 upon pre-charge operation, it is possible to bring the level of the bit line 7 to $V_1 - \Delta V$ by appropriately selecting the capacitor $C_2$ in the cell 22. Here it is a matter of course that the capacitances of the capacitors $C_1$ and $C_2$ must be determined in such a manner that when a memory cell information is logic "0", the level change on the digit line to which that memory cell is connected may be larger than the level change on the other digit line caused by the reference cell.

Figure 5:
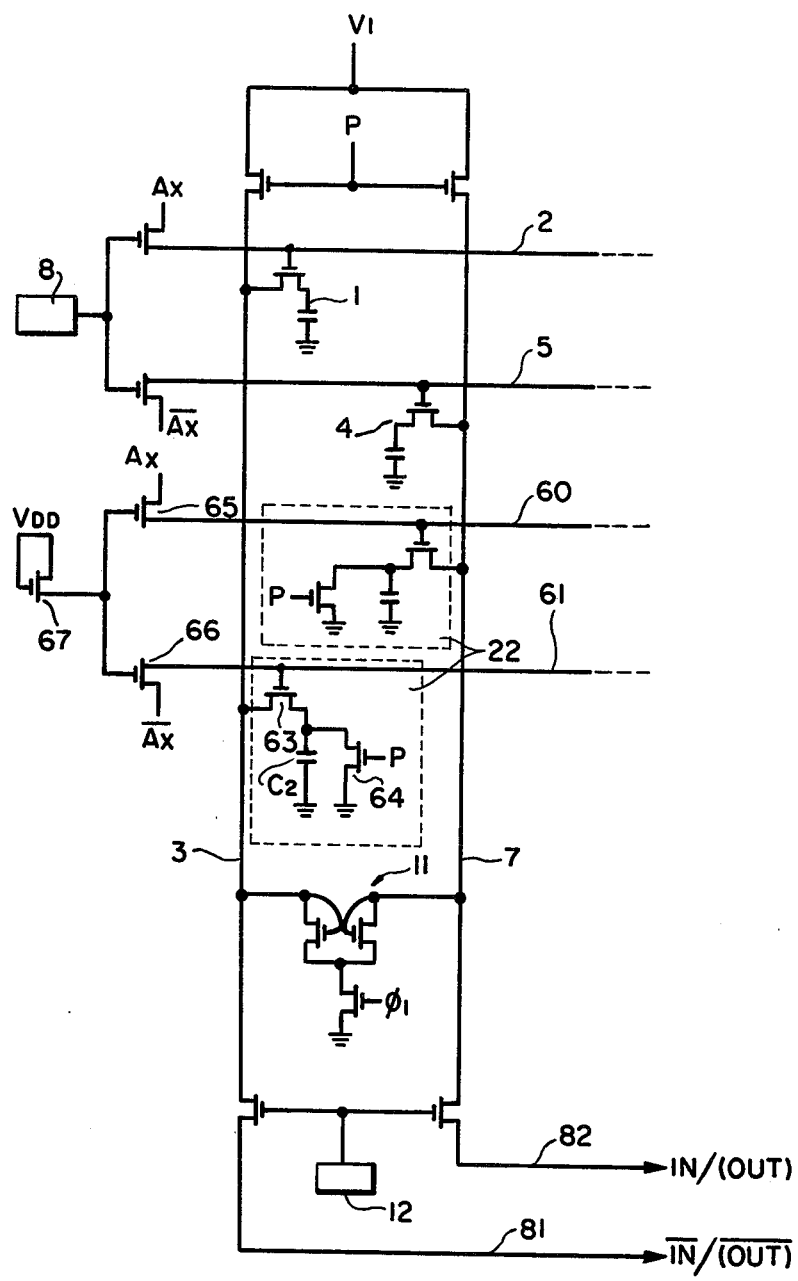
FIG. 5 is a schematic circuit diagram showing a part of a memory circuit according to another preferred embodiment of the present invention.
Figure 6:
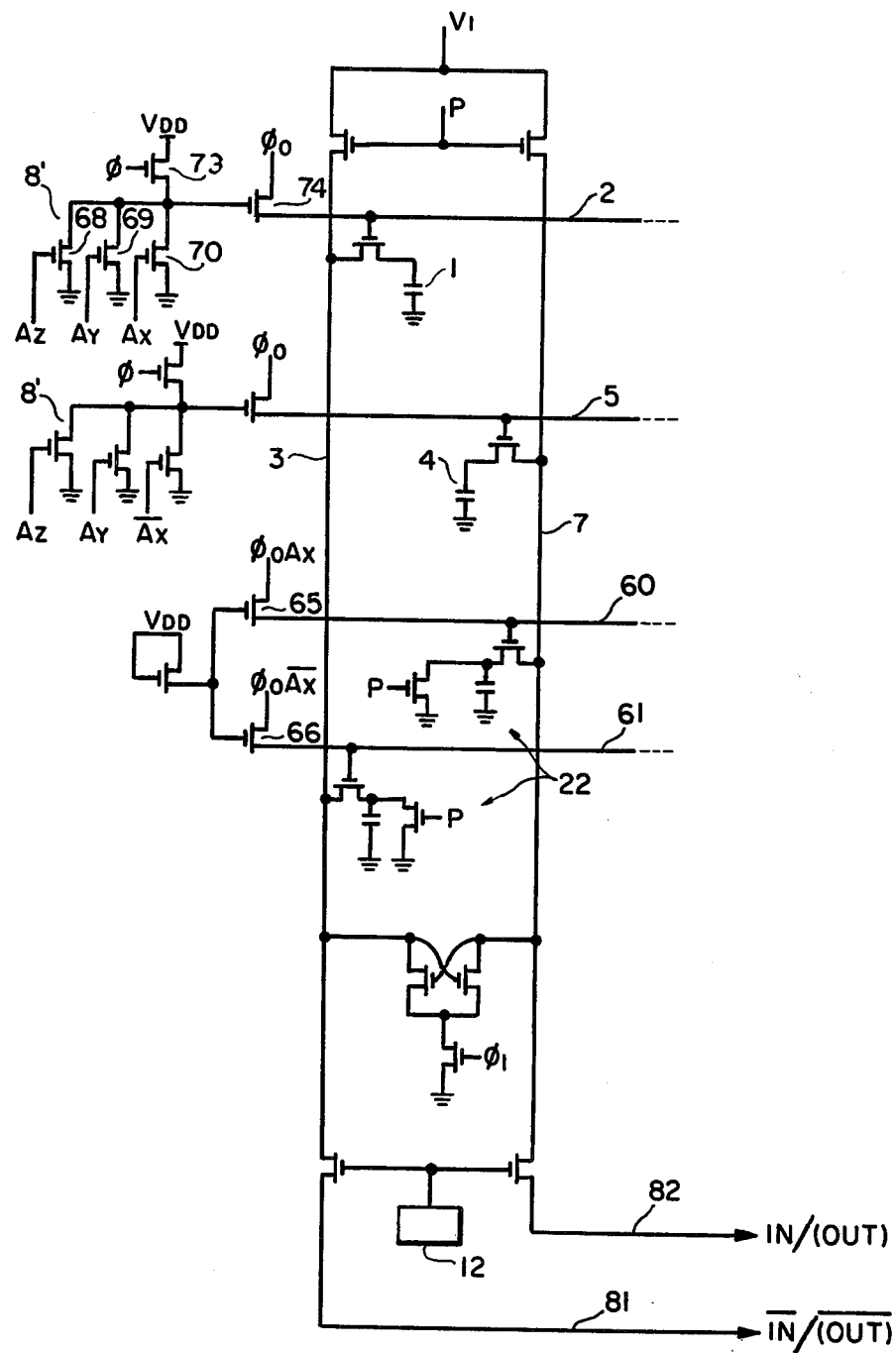
FIG. 6 is a schematic circuit diagram showing a part of a memory circuit according to still another preferred embodiment of the present invention.

FIG. 6 is a schematic partial circuit diagram of a modification of the embodiment shown in FIG. 5, in which in place of the X-decoder 8 in FIG. 5, X-decoders 8' for selecting the respective word lines are individually provided. More particularly, address signals $A_z$, $A_y$ and $A_x$ ($\overline{A_x}$) are applied to the respective gates of MOST's 68, 69 and 70, respectively, whose sources and drains are respectively connected in common. To a gate of a load MOST 73 that is common to these MOST's 68, 69 and 70 is applied a decoder activation signal $\phi$. By these MOST's 68 – 70 and 73 is formed a NOR decoder, and an output of this NOR decoder is applied to a gate of an address driver MOST 74. To the drain of the MOST 74 is applied a timing signal $\phi_o$, while to the source of MOST 74 is connected the word line 2(5). As the operations of such NOR decoder circuits and address driver circuits are well known, more detailed description will be omitted. The timing signals to be applied to the reference selection lines 60 and 61 at this time could be $\phi_oA_x$ and $\phi_o\overline{A_x}$, respectively.

What is claimed is:

1. A memory circuit arrangement comprising a pair of first and second digit lines, first and second word lines intersecting with said pair of digit lines and forming cross-points therebetween, a first memory cell provided at the cross-point of said first digit line and said first word line and connected to said respective first lines, a second memory cell provided at the cross-point of said second digit line and said second word line and connected to said respective second lines, a sense amplifier, having terminals connected to said first and second digit lines for detecting the state of logic signals stored in said memory cells, first and second transfer gates coupled to said first and second word lines, respectively, said first transfer gate transferring an activation signal for activating said first word line and said second transfer gate transferring a signal complementary to said activation signal in polarity to said second word line, and selecting means for selectively controlling said first and second transfer gates simultaneously.

2. The memory circuit arrangement of claim 1 in which said first and second transfer gates transfer said activation signal and the complement of said activation signal to said first and second word lines respectively in response to a read command signal.

3. A memory circuit arrangement comprising at least a pair of first and second digit lines, first and second memory cells connected respectively to said first and second digit lines, said memory cells including means for storing incoming logic signals, gating means for applying incoming logic signals to said first and second digit lines and a sense amplifier having first and second differential input terminals connected respectively to said first and second digit lines, the sense amplifier including means for detecting the state of the logic signals stored in the memory cells, and gating means further including means responsive to a write command signal for simultaneously applying the true value of an incoming logic signal to said first digit line and to said first differential input terminal and the complement value of the incoming logic signal to said second digit line and to said second differential input terminal.

4. A memory circuit arrangement in accordance with claim 3 further including first and second word lines intersecting said digit lines, said first and second memory cells being respectively connected to said first and second word lines and gating means responsive to a read command signal for selectively applying an enabling signal to a predetermined one of the word lines and to the memory cell connected thereto.

5. A memory circuit arrangement comprising at least a pair of first and second digit lines, first and second word lines intersecting with said pair of digit lines and forming cross-points therebetween, a first memory cell provided at the cross-point of said first digit line and said first word line and connected to said respective first lines, a second memory cell provided at the cross-point of said second digit line and said second word line and connected to said respective second lines, a sense amplifier, having terminals connected to said first and second digit lines for detecting the state of logic signals stored in said memory cells, means for selecting a pair of said first and second word lines simultaneously, and means responsive to said selecting means for selecting one of said first and second word lines.

6. The memory circuit arrangement of claim 5 further comprising a first reference cell connected to said first digit line and said second word line and a second reference cell connected to said second digit line and said first word line.

* * * * *